United States Patent [19]

Kubo et al.

[11] Patent Number: 4,778,539
[45] Date of Patent: Oct. 18, 1988

[54] PROCESS FOR PRODUCING A $PbMo_6S_8$ TYPE COMPOUND SUPERCONDUCTOR

[75] Inventors: Yoshio Kubo; Kiyoshi Yoshizaki, both of Shagamihara, Japan

[73] Assignee: Mitsubishi Denki Kabushiki Kaisha, Tokyo, Japan

[21] Appl. No.: 932,199

[22] Filed: Nov. 18, 1986

[30] Foreign Application Priority Data

| Jul. 9, 1984 | [JP] | Japan | 59-140632 |
| Jul. 9, 1984 | [JP] | Japan | 59-140633 |
| May 8, 1985 | [JP] | Japan | 60-97005 |
| May 8, 1985 | [JP] | Japan | 60-97007 |

[51] Int. Cl.$^4$ .............................................. C21D 8/10
[52] U.S. Cl. ........................... 148/11.5 P; 148/11.5 Q
[58] Field of Search ................. 148/11.5 F, 11.5 Q, 148/11.5 P, 11.5 R, 12.7 B; 419/4

[56] References Cited

U.S. PATENT DOCUMENTS

| 4,402,768 | 9/1983 | Flükiger | 148/11.5 P |
| 4,505,762 | 3/1985 | Fakutsuka et al. | 148/11.5 F |
| 4,704,249 | 11/1985 | Glatzle | 419/4 |

OTHER PUBLICATIONS

IEE Transaction on Magnetics, "Investigation of the Properties of $PbMo_6S_8$ Powder Processed Wires", vol. MAG-19, No. 3, May 1983, pp. 402–405.

J. Appl. Phys. 49 (2), Feb. 1978; pp. 936–938, "Superconducting Wires of $PbMo_5S_6$ by a Powder Technique".

Ternary Superconductors: "$PbMo_6S_8$: A New Generation of SuperConducting Wires"; 1981, Elsevier North Holland, Inc. Shenoy, Dunlap, Fradin, eds.

Primary Examiner—L. Dewayne Rutledge
Assistant Examiner—S. Kastler
Attorney, Agent, or Firm—Burns, Doane, Swecker & Mathis

[57] ABSTRACT

The present invention is designated to solve such problems whereby a process for producing a $PbMo_6S_8$ type compound superconductor excellent in stoichiometric composition and electric characteristics can be provided.

In addition to the above, another purpose of the present invention is to provide a process for producing a $PbMo_6S_8$ type compound superconductor with stable electrical characteristics.

11 Claims, 1 Drawing Sheet

PROCESS FOR PRODUCING A PBMO₆S₈ TYPE COMPOUND SUPERCONDUCTOR

This application is a continuation of application Ser. No. 06/753,233, filed July 9, 1985 now abandoned.

BACKGROUND OF THE INVENTION

Recently, there is a desire to develop superconductive magnets generating higher magnetic fields in response to the increasing demands for high magnetic field magnets in such fields as nuclear fusion, high energy physics research and solid state physics research. The wire rods for superconductive magnet put into practical use up to the present have been Nb-Ti alloy base wire rods and Nb$_3$Sn and V$_3$Ga compound base wire rods, but since their critical magnetic fields are said to be about 11T (tesla) and 22T at 4.2 K. respectively, the maximum magnetic field obtained as a superconductive magnet would be about 14T in due regards to current capacity and efficiency. If it is desired to achieve an even higher magnetic field, raw materials of a higher level critical magnetic field would be necessary.

From such a technical background, the compounds called "Chevrel-phase compounds" which are Mo ternary calcogenide, have been drawing attention, and among them the Chevrel-Phase lead molybdenum sulfide PbMo$_6$S$_8$ (PbMo$_6$S$_8$ herein after) has been highly evaluated due to its high critical magnetic field reaching over 50T at 4.2 K. so that it can be said that a critical magnetic field of around 20–30T could possibly be generated if a magnet employing this compound is put into practical use.

Concerning PbMo$_6$S$_8$, recent improvements in the fabrication of PbMo$_6$S$_8$ wires by a powder-metallurgical-technique have been described in *IEEE Transaction on Magnetics*, Vol. Mag-19, No. 3 May 1983, P402–405, "Investigation of the Properties of PbMo$_6$S$_8$ Powder Processed Wires", on the synthesis of PbMo$_6$S$_8$ by employing an Ag barrier in the *Journal of Applied Physics* 49 (2) February, 1978, P936–938, "Superconducting Wires of PbMo$_{5.1}$S$_6$ by a Power Technique", on the study of a process for producing PbMo$_6$S$_8$ compound wire rod material by power-metallurgical-techniques using Mo barrier in *"Ternary Superconductors"* published 1981 by Elsevier North Holland, Inc. Shenoy, Dunlap, Fradin, eds., "PbMo$_6$S$_8$: A new Generation of Superconducting Wires?", respectively.

As seen in the above mentioned prior art, some attempts on the development of PbMo$_6$S$_8$ type compound superconductors have been done, wherein a wire material was produced by charging a mixed powder comprising respective powder constituent of PbMo$_6$S$_8$, for example Mo, Pb, MoS etc. into a Ta or Mo tube subject to thermal treatment after processing, to then obtain a PbMo$_6$S$_8$ compound.

Nevertheless in such attempts, a problem in the process for producing PbMo$_6$S$_8$ still remains, that is, high critical current density under application of a magnetic field (Jc) could not be obtained by the prior art, since a layer of compound excellent in stoichiometric composition could not be expected from the prior art.

Then, in order to improve the Jc characteristics by densifing the powder materials, a sintering process of mixed powder by a hot press has been devised, however an applicable long wire material as a coil winding material for superconductive magnet could not be produced while only a bulk shape sized sample is obtained.

SUMMARY OF THE INVENTION

The present invention is designed to solve such problems whereby a process for producing a PbMo$_6$S$_8$ compound base superconductor excellent in stoichiometric composition and electric characteristics can be provided.

In addition to the above, another purpose of the present invention is to provide a process for producing a PbMo$_6$S$_8$ type compound superconductor with stable electric characteristics.

The process of the present invention is, a process for producing PbMo$_6$S$_8$ type compound superconductor comprising the three steps of: obtaining a composite by filling into a barrier material at least one of PbMo$_6$S$_8$ type compound and a mixed material containing Pb, Mo and S as components in such proportions that a PbMo$_6$S$_8$ type compound is finally obtained, said components being selected from Mo, Mo sulfides, Pb, Pb sulfides and S; processing the composite to reduce its cross section; and thermally treating under pressure said reduced cross section composite at a temperature above 800° C.

The process for producing PbMo$_6$S$_8$ type compound superconductor according to another invention of the present application is one in which one more step is added, wherein a electric conductive metal that is thermally and electrically a good conductor is put on the above thermally treated composite.

Since thus, a PbMo$_6$S$_8$ type compound excellent in stoichiometric composition can be obtained by treating at the high temperatures under high pressures of the present invention, the electric characteristics of the compound can be much improved.

Moreover, even more excellent electric characteristics can be obtained with another invention of the present application by putting a common electric conductive metal on the composite.

DESCRIPTION OF THE PREFERRED EMBODIMENTS

Figure 1:
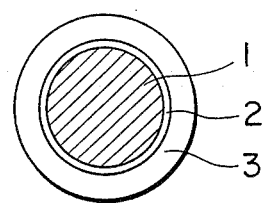
FIG. 1 represents a vertical cross-section of a composite wire of the present invention after cross-sectional reduction of said composite wire having a stabilizer.

FIG. 1 is a view in relation to an embodiment of the present invention showing a cross section of the composite after being reduced, wherein (1) is the mixture, (2) is a Ta tube as a barrier material and (3) is a stabilizing material which is a tube made of Cu, a common electric conductive metal being a good electrical and thermal conductor.

In the present invention, although the mixture (1) can be produced from powders of, for example Mo, Pb and MoS$_2$, other forms of components for example Pb flakes in place of Pb powder can also be employed.

Furthermore, the combination of components for the mixture is not restricted to those mentioned above. That is, other than the above the following combinations of components for the mixture (1) are also applicable:

Mo, Pb, $Mo_2S_3$; Mo, Pb, $MoS_2$, $Mo_2S_3$; Mo, PbS, $MoS_2$; Mo, Pb, PbS; Mo, Pb, PbS, $MoS_2$; Pb, Mo, S; $MoS_2$, Pb; $MoS_2$, Pb, PbS; $MoS_2$, PbS; Mo, PbS etc.

can be used if they produce $PbMo_6S_8$ compounds after heat treatment.

Moreover, due to internal sulfur pressure reduction in the Ta tube (2), the barrier material in FIG. 1, protection of the barrier from sulfurization and the case in which the necessary stoichiometric composition of the finally produced $PbMo_6S_8$ type compounds for improvement of the superconductive characteristics can be realized, all from employing produced by previously heat treating, crushing and re-powdering $PbMo_6S_8$ type compounds as a component of the mixture (1), it can be said that the present invention is extremely effective in producing unfathomable advantages for superconductors.

Even though the $PbMo_6S_8$ type compounds in the present invention practically includes various $PbMo_6S_8$ family compounds differing in the number of the elements Pb, Mo and S, for example $PbMo_{5.1}S_6$, $PbMoS_7$ etc., these compounds will generally be referred to as "$PbMo_6S_8$ type compounds" in the explanations, hereinafter. Furthermore, those compounds $PbM'xMo_6S_8$ (x: 0.001~0.5) in which a little amount of M' is added, wherein M' is Ga, Bi, Ba, Sn, La, Ho, Eu, Gd, Lu, Y, Nd etc., for example, are also included in the $PbMo_6S_8$ type compounds.

The heat treating temperature in the present invention ranges from 800° C. to practically below 2,200° C., however the most stoichiometrically preferable product can be obtained through a heat treatment of above 1000° C. The upper limit of heat treating temperature should be chosen depending on the melting point of Mo (M.P. 2617° C.), Nb (M.P. 2467° C.), Ta (M.P. 2977° C.) etc. employed in the barrier material. In a case, where a common conductive metal, for example Cu, has already been put on the composite, the heat treating temperature will be restricted below the 1083.4° C., melting point of Cu. However, a heat treatment under pressure of a composite without the common conductive metal can safely be carried out choosing the optimum treatment conditions at temperatures above 1080° C. The lower limit of heat treating temperature must be 800° C. $PbMo_6S_8$ type compounds can not be produced at a temperature below 800° C.

The pressure at the time of heat-treatment is practically ranged from 100 kg/cm² to 2000 kg/cm² while higher pressures generally produce better current characteristic, and pressure increases by methods such as diamond anvil are also effective.

On the contrary, a pressure lower than 100 kg/cm² results in poor characteristics of the product.

The pressure could also be applied under unidirectional pressure as well as under hydrostatic pressure, where hydrostatic pressure means a uniform and isotropic pressure applied to the object at the time of HIP (Hot Isostatic Press) treatment while unidirectional pressure means a state where pressure is applied only along one direction.

Even though the $PbMo_6S_8$ type compound wire was fabricated as a single conductor wire, the multiplication of wire by combining single conductor wires and the twisting processing of wire can reduce A.C. loss while stabilizing the magnet, and this fabrication can easily be made in the same manner as the prior art of $Nb_3Sn$ wire material.

EXAMPLES

The present invention will be further concretely explained in accordance with the following non-limitting examples.

EXAMPLE 1

The components of $PbMo_6S_8$ compounds, Mo, Pb, and $MoS_2$ powder (respective particle diameters and purities are 3 μm and 99.9%, 40 μm and 99.9%, and 2 μm and 99%) were mixed as homogeneously as possible in a proportion of 5:2:7, and the mixture (1) (see FIG. 1) was molded in a press. This mixture (1) was made into a composite with a Ta tube (2), as a barrier material and a Cu tube (3), as a stabilizing material, then was processed so as to reduce its cross section down to 1.0 mm in diameter by cold-drawing, thus obtaining a wire of about 30 m in length. Through the drawing step, excellent processing characteristics were exhibited without any breakage of wire.

In the next step, this wire material was coiled in a diameter of 300 mm and was put into a hot hydrostatic pressure unit and heat treated at 1000° C., for 0.5 hours under a pressure of 1800 kg/cm², wherein argon gas was adopted as an inert pressurizing gas. The critical electric current (Ic) characteristic of the obtained wire material was measured at the temperature of liquid helium (4.2 K.) under an applied filed (max. 12T). Hence, a very high Jc of 143 A, i.e., about ten times that of the same structural wire material at 12T which was heat-treated without pressurizing, was obtained. Furthermore, in comparison with a bulk sample of the prior art produced by hot press under the same heat-treating conditions, it was found that the critical current density according to the present invention was improved to an extent of almost 50%.

It can be felt that the Ic characteristics were improved because packing density of $PbMo_6S_8$ type compound wire material of the prior art produced without pressurizing is at the most 60% while that of the compounds heat-treated under hydrostatic pressure reached about 80%. It was also exhibited that since the Jc ratio of this wire material at 10T and 12T, the comparative of Jc (10T)/Jc (12T) was about 1.3 which was very small in comparison to the 2.1~2.4 of typical $Nb_3Sn$ base wire material in practical use, the compounds according to the present invention have a higher Jc than that of $Nb_3S_n$ base wire material in higher magnetic fields (higher than 16T, in this case).

It is can then be felt that the compounds according to the present invention could be advantageously employed as a coil material for magnets generating super-high magnetic fields.

EXAMPLE 2

The components of $PbMo_6S_8$ type compounds, Mo, PbS and $MoS_2$ powder (respective particle diameters and purities of Mo and $MoS_2$ are the same as those of Example 1, and PbS: 40 μm and 99.9%) were mixed as homogeneously as possible in a proportion of 1:1:3, then a pellet was prepared by molding. The pellet was inserted into a quartz tube under vacuum, and heat-treated at 1100°~1200° C., to produce a $PbMo_6S_8$ type compound. In the next step, the pellet was crushed to obtain powder, and a mixture was produced by secondary press molding. The mixture was made into a composite with a Ta tube and a Cu tube stabilizing material, then drawn down to 1 mm in diameter to obtain a wire. Further, heat-treatment under hydrostatic pressure was carried out under the same conditions as Example 1. Measuring the Ic characteristics of this wire material, an Ic of 12T, about 20% higher than that of Example 1, was obtained.

Thus, since Example 2 produced excellent results, the wire material according to the present invention should be very effective as a coil material for super-high magnetic field use.

EXAMPLE 3

The components of $PbMo_6S_8$ type compounds, Mo, Pb and $MoS_2$ powder (respective particle diameters and purities were 3 μm and 99.9%, 40 μm and 99.9% and 2 μm and 99% respectively) were homogeneously mixed in a proportion of 5:2:7 and stirred, then press moleded to obtain the mixture (1) (see FIG. 1). This mixture (1) was made into a composite with Ta tube (2) as a barrier material and Cu tube (3) as a stabilizing material, then the obtained composite rod was processed to reduce its cross-section by cold-drawing to obtain a wire of 1.5 mm in diameter. FIG. 1 is a picture showing a cross-section of this wire material. Excellent drawing characteristic were exhibited without wire breakage.

Figure 2:
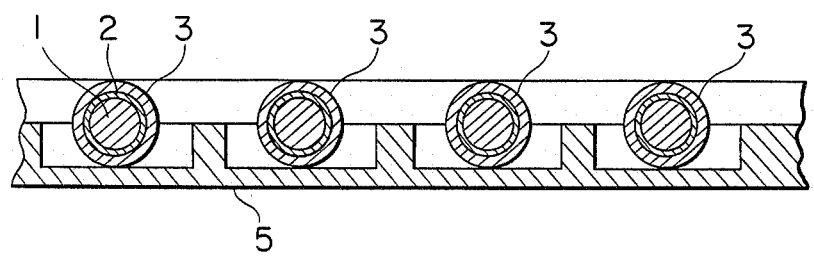
FIG. 2 represents a vertical cross-section of a stainless steel plate and wire prior to pressure-thermal treatment in the production of a superconductive magnet according to an embodiment of the present invention.

In the proceeding step, after applying a braid over braid S fiber glass insulator over the wire material, this insulated wire material was inserted into a groove of 2.4 mm width, 0.8 mm depth and 2.8 mm pitch, spirally cut in a circular stainless steel plate (SUS 304) of 120 mm outer diameter, 30 mm bore diameter and 1.1 mm thick. A cross-section of the stainless steel plate with groove (5) and insulated wire material is shown in FIG. 2. Both ends of this wire material were sealed with a Ta cap.

In the next step, a SUS plate surface-coated with BN (Boron Nitride) powder was sandwiched over the spirally inserted wire material in order to protect it from welding, then the object was set in a hot-press device and pressed under a vacuum of $1 \times 10^{-5}$ Torr for 0.5–5 hours, 3 hours in this case.

The hot-press was carried out under high temperature of 950° C. and high pressure of 1800 kg/cm² (per area of wire material). Regarding the operative order of temperature elevation and prssure application, there are three cases, i.e., applying pressure after temperature elevation, elevating temperature after some extent of pressure application and applying pressure up to the designed level after full temperature elevation, and in any of the above cases, fine hot-press processing was exhibited and excellent characteristics were obtained. The thus produced pancake like coil, 120 mm diamter and 1.35 mm thick, was set in a $Nb_3Sn$ superconductive magnet having a bore diamter of 130 mm to measure critical current. Hence, the critical current at the time of quenching under an applied magnetic field of 12T was 291 A which is approximately 10 times higher than the critical current density of the coil provided by conventional sputtering or powder-metallurgical techniques and indicates a remarkable improvement.

Moreover, preparing thirty seven pancake like coils in the same manner as the above mentioned process and a laminate was produced by stacking the coils with S glass fiber sheets inserted therebetween. The wiring between each pancake coil was made by soldering copper plates 2.7 mm in width, 0.5 mm thick, and 40 mm in length, to both ends of the hot-pressed flat spiral wire material and taking out the necessary voltage taps, and then the thirty seven layer laminate pancake coil was entirely immersed into an epoxy compounds.

In order to examine the magnetic field to be induced by the superconducting magnet of $PbMo_6S_8$ thus resulted, a hall device in set in the center of the bore of the pancake like magnet which is then set in a hybrid $Nb_3S_n$ superconducting magnet. The assembly thus resulted was subjected to an electric current passage test under a bias magnetic field of 12T in liquid helium. As a result, it was confirmed that up to 200 A, the $PbMo_6S_8$ type compound superconducting magnet operates stably without quenching, and the measurement of the central magnetic field by the hall device was 13.9T. From this result, it was confirmed that a $PbMo_6S_8$ base compound superconducting magnet steadily and securely generates a field of about 2T in a magnetic field bias of 12T.

EXAMPLE 4

A wire of ϕ1.5 mm was obtained as in Example 3.

The wire was then insulated by interleaved S glass fiber followed by intimately winding the resultant insulated wire around a round rod, 30 mm in diameter, to form a single coiled solenoid, 130 mm in length which was temporarily fixed using a jig. Then the round rod at the center was removed leaving an untreated $PbMo_6S_8$ wire in the form of a solenoid. The wire had been previously processed with Ta caps at the ends to seal in sulfur gas.

The untreated solenoid wire was subjected to a Hot Isostatic Pressure (HIP) treatment at a pressure of 2000 kg/cm² and a temperature of 1000° C. for 2 hours under an atmosphere of argon. As the process for temperature increase and pressure application, a process wherein the HIP apparatus is heated after some pressure is applied and thereafter increasing pressure upto the final pressure and the process wherein the temperature is increased and then pressure is applied were both carried out. In both cases, an elevated temperature and pressure treatment by HIP processing gave excellent properties. If the temperature was in excess of 900° C., there appeared solenoid coils having uncertain insulation and therefore when the reaction was carried out at a temperature higher than 900° C., the solenoid wire was first subjected to HIP treatment without insulation and thereafter the insulation is carried out by using a technique of vacuum impregnation with an epoxy resin.

The solenoid coil thus prepared (33.5 mm in O.D. and single solenoid layer length of 100 mm was used to measure the critical current in liquid helium under application of an exterior magnetic field. The results were that the critical current represents 222 A at the applied magnetic field of 12T which is 10 times greater than that of conventional ones.

Further, in order to form a magnet by superposing solenoid coils, 25 single coiled solenoids having an inner diameter (I.D.) of $30 + 1.8 \times 2$ (N−1) mm where N represents 1 to 25 were prepared by HIP treatment. In the HIP treatment, the 25 single coiled solenoids were subjected to an aggregate of 3 separate HIP treatments by fixing every third larger single coiled solenoids to each other in a jig starting from the smallest (N=1) in a first group, (N=2) in a second group and N=3 in a third group). The 25 single coiled solenoid thus prepared were arranged concentrically and the gaps of each coil layer were fixed by soldering them with oxygen. free copper strips, 4 mm in width, 15-20 mm in length and 0.5 mm in thickness, having a form conforming with the peripheral circular lines of both sides of the coils and attaching the necessary voltage taps, followed by vacuum impregnation with epoxy resin to integrate these coils.

The $PbMo_6S_8$ type compound superconducting magnet thus resulted was evaluated. A magnetic field generation test was conducted by setting a hall device in the center of said magnet and the resultant assembly was set in the afore-mentioned hybrid magnet and, after the generation of a magnetic field bias of 12T, an electric current was passed to the $PbMo_6S_8$ base compound superconducting magnet. Thee results demonstrate that after training by several quenchings, a maximum magnetic field of 15.0T in total at a current of 214 A could finally be generated.

In addition, in order to prepare greater magent, some modification should be applied to the manner of applying pressure to the wound coils and the thermal treatment, for example, by sandwiching the pancake like coil with thick plates of metal, locking the plates with bolts to apply a predetermined pressure and subjecting to the thermal treatment in this condition. In short, the thermal treatment can be carried out in a pressed state under a predetermined temperature and period of time and any method such as hot-pressing or HIP treatment method can be employed.

Further even through various methods of making a superconducting wire and a superconducting magnet are described herein as working Examples according to the present invention, it should be noted that these methods are generally referred to as a method of producing a superconductor.

EXAMPLE 5

Figure 3:
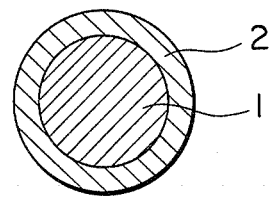
FIG. 3 represents a vertical cross-section of composite wire after cross-sectional reduction but prior to applying a stabilizer coating.

An amount of powdered metallic Mo, Pb and $MoS_2$, the particle sizes of which were 3 μm, 10 μm and 2 μm in that order and each having a purity of 99.9% were mixed as uniformly as possible in an atomic ratio of 1:6:7 of Pb:Mo:S and then the resultant mixture was pressed to form a blend 1 as indicated in FIG. 3. The blend (1) was composited with a Tantal pipe (2) as a barrier material and then the composite was processed by swaging, grooved roll processing and drawing to effect a cross-section reduction to a diameter of 1.0 mm. FIG. 3 shows the a vertical cross-section of the drawn composite. The processes set forth above were effected in a very favourable manner wihout wire breakage.

The resulting composite, i.e. wire material was wound in circle 300 mm in diameter, then placed in a hot hydrostatic unit and subjected to a thermal treatment at 1100° C., under a pressure of 2000 kg/cm² for 2 hours in this case, but can be anywhere from 0.2-3 hours. As the pressurizing medium an inert argon gas was used. The wire material thus treated was subjected to an electroplating to deposit copper as a stabilizer, thus, obtaining the $PbMo_6S_8$ type compound superconducting wire as an embodiment of the present invention. In addition to copper, aluminium may be effectively deposited.

A portion of said wire was extracted and measured for its critical current (Ic) characteristics at the temperature of liquefied helium (4.2° K.) under an applied magnetic field of 12T maximum, showing a very high Ic of 170-250 A.

The results indicates that the Ic is greater the higher the thermal treatment temperature is above 800° C., but the Ic dropped when the thermal treatment temperature is increased beyond 2200° C. due to a severe sulfiding of the Ta. The reason behind this improvement in Ic is believed to be that a $PbMo_6S_8$ is formed having a composition close to the stoichiometric one.

The wire has a Jc ratio of 10T/12T, i.e. a Jc ratio of about 1.3 which is very small in comparison to 2.1-2.4 of any typical $Nb_3Sn$ base material conventionally in practice and at higher magnetic fields for example at higher than 16T for the wire this example, has a higher Jc than that of $Nb_3Sn$ base material.

The wire in this Example, therefore is believed to be an effective winding material for a magnet for a super-high magnetic fields having greater generated fields than 16T.

EXAMPLE 6

Using the same powdered materials as in Example 5, a blend obtained by mixing said materials in an atomic ratio of 1:6:8 of Pb:Mo:S was composited with a molybdenum (Mo) pipe, as a barrier material and then the resulting composite was subjected to hot cross-reduction processing by swaging followed by groove roll processing at a temperature of 600° C. to 900° c. to a diameter 1.5 mm. The material thus obtained was further heat-treated under hydrostatic conditions similar to that of Example 5 to obtain a $PbMo_6S_8$ type compound superconducting wire according to the present invention. The Fc of this wire was also measured and an Ic about 40% higher than that of the wire of Example 5 to 12T was obtained. In this wire, the higher the temperature of thermal treatment, the better the Ic obtained as in Example 5.

The wire obtained in this Example according to the present invention is quite effective for example as a winding for high magnetic fields as seen from the very good results.

EXAMPLE 7

Powdered metallic Mo and Pb and $Mo_2S_3$ powders as the constituents for $PbMo_6S_8$, each having a particle size and purity of 3μ and 99.9%, less than 4 μm and 99.9% and 4 μm and 99.9% respectively were mixed in an atomic ratio of 2:3:8 as uniformly as possible and the mixture thus obtained was pressed to form a blend (1) as shown in FIG. 1. The blend (1) was composited with a barrier Ta pipe (2) and a stabilizer, Cu pipe (3) and then the resulting composite was subjected to a cool drawing to reduce its cross-section to 0.1 mm in diameter thereby elongating its length to about 30 m without any wire breakage indicating quite favourable processability.

The wire thus obtained was wound in the form of a circle of 300 mm diameter. The ends of this wire are sealed with Ta Caps and thereafter it was placed in a HIP apparatus and thermally treated at a hydrostatic pressure of 1900 kg/cm², and a temperature of 1000° C. for 2 hours to obtain a $PbMo_6S_8$ type compound superconductive wire according to this example of the present invention.

The period of time can be varied within the range of 1 and 3 hours. As a pressure medium inert argon gas was used. A portion of the wire was extracted and the Ic characteristics of said wire were measured at the temperature of liquefied helium (4.2° K.) under an applied magnetic field of 12T maximum. The result indicates 155 A as the Ic value at 12T, 11 times higher than that of the same construction prepared by the thermal treatment without applying pressure. This Ic value showed about a 10% improvement compared with that of the wire prepared in a similar way by using $MoS_2$ powders in place of $Mo_2S_3$.

Figure 4:
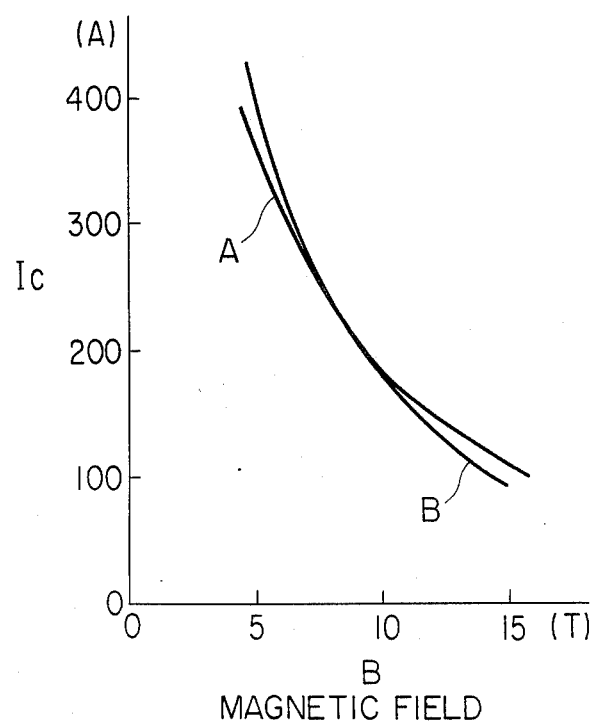
FIG. 4 represents the electric characteristics (critical current, in amperes) in relation to a magnetic field (expressed in T) of the superconductor using Mo$_2$S$_3$ and MoS$_2$ according to the present invention.

FIG. 4 elucidates the varying Ic of the $PbMo_6S_8$ type compounds against the magnetic field in which curves A and B represent the Ic characteristic curves of the $PbMo_6S_8$ type compound superconducting wires prepared by using $Mo_2S_3$ powders and $MoS_2$ powders respectively. As shown in this Fig. the reduction rate of the Ic of wire according to this example is lower than that of the wire prepared by using $MoS_2$ at a magnetic field higher than 10T. Further, it should particularly be noted that the critical magnetic field (Bc$_2$) of the wire according to this Example calculated on the basis of Kramer's theorem amounts to about 50T which is higher by about 5-50T than that of the latter. Moreover, this demonstrates that the wire according to the present Example has a quite small ratio of Jc at 10T and 12T [Jc(10T)/Jc(12T)] equal to about 1.3 less than that the 2.1-2.4 of the Nb$_3$Sn base material typical conventional practical wire, and that at higher magnetic fields (higher than 16T for the wire according to the present Example) the former has a higher Jc than the latter.

Therefore, it is believed that the wire obtained according to the present Example is effective as a wire material for superhigh magnetic fields having generated fields of greater than 16T.

As set forth above, it can be felt that the reason why superior electric characteristics are shown by the $PbMo_6S_8$ base material superconducting wire prepared by employing $Mo_2S_3$ is due to the fact that the sulfur release initiation temperature of $Mo_2S_3$ is about 900° C. which is approximately equal to the temperature of 900° C.-1100° C. at which $PbMo_6S_8$ type compound having closer stoichiometrical composition thereof is formed so that any $PbMo_6S_8$ type compounds having lower stoichiometrical composition are prevented from being created. Thus it is believed that the use of $Mo_2S_3$ overcomes the adverse effects brought about on the electrical characteristics of $PbMo_6S_8$ type compounds prepared by using $MoS_2$ due to said compound having a lower stoichiometric composition formed during the course of temperature increase because $MoS_2$ has a sulfur release initiation temperature indicated by the equation of $MoS_2 \rightarrow \frac{1}{2}Mo_2S_3 + \frac{1}{2}S$ of about 500° C. which is considerablly lower than 900°-1100° C. thereby permitting the formation of said lower stoichiometric compound during the elevation of temperature.

As set forth above, according to the present invention, a dense $PbMo_6S_8$ compound having closer stoichiometric composition can be obtained which permits the formation of long wires or magnet composed of $PbMo_6S_8$ having superior super-conductivity characteristics never obtained before. Thus the present invention makes it possible to generate a super high magnetic fields of greater than 16T which cannot be generated by conventional Nb$_3$Sn magnets and which is useful for the development of nuclear fusion and the physical studies of high Energy.

Further, the present invention permits the production of a superconductive magnet composed of $PbMo_6S_8$ type compounds which has never been produced up to date by avoiding the technical difficulties occurring at the stage of magnet formation because of the brittleness of the conventionally prepared $PbMo_6S_8$. In addition the present invention makes it possible to obtain a $PbMo_6S_8$ type compound superconductive magnet which can generate a total higher magnetic field of 15T under a bias magnet of 12T as a result of a marked improvement of the critical current density which is of low value conventionally.

In addition, by the use of $Mo_2S_3$ for example, having a higher ion release initiation temperature a $PbMo_6S_8$ type compound super-conductor having a composition closer to the stoichiometric one.

The present invention provide as an another embodiment a method of producing a $PbMo_6S_8$ type compound superconductor having electrical characteristics of excellent stability by applying good electric and thermal-conductive metal to the $PbMo_6S_8$ wire after the thermal treatment thereof.

We claim:

1. A process for producing a $PbMo_6S_8$ compound superconductor comprising the three steps of:
   a. obtaining a composite by filling into a barrier material one of a mixed material containing Pb, Mo and S as components in such proportions that a $PbMo_6S_8$ compound is finally obtained, said components being selected from Mo, Mo sulfides, Pb, Pb sulfides and S;
   b. reducing the cross section of said composite, and
   c. thermally treating said reduced cross section composite at a temperature above 800° C. and a pressure of at least 100 kg/cm$^2$ to produce a $PbMo_6S_8$ compound of excellent stoichiometric composition and electrical characteristics.

2. A process for producing $PbMo_6S_8$ compound superconductors according to claim 1 wherein the thermal treatment temperature is above 900° C.

3. A process for producing $PbMo_6S_8$ compound superconductors according to claim 1 wherein the pressure is above 100 kg/cm$^2$.

4. A process for producing $PbMo_6S_8$ compound superconductors according to claim 1 wherein the pressure is above 1500 kg/cm$^2$.

5. A process for producing $PbMo_6S_8$ compound superconductors according to claim 2 wherein the pressure is above 1500 kg/cm$^2$.

6. A process for producing $PbMo_6S_8$ compound superconductors according to claim 1 wherein the mixed material filled into the barrier material is a mixed material obtained by mixing raw materials containing Mo, Pb and Mo sulfide having a higher sulfur isolation initiating temperature than that of $MoS_2$ in such proportions that a $PbMo_6S_8$ type compound is finally obtained.

7. A process for producing $PbMo_6S_8$ compound superconductors according to claim 6 wherein the Mo sulfide material is $Mo_2S_3$, the sulfur isolation initiating temperature of which is higher than that of $MoS_2$.

8. A process for producing $PbMo_6S_8$ compound superconductor comprising the four steps of:
   a. obtaining a composite by filling into a barrier material one of a mixed material containing Pb, Mo and S as componenets in such proportions that a $PbMo_6S_8$ compound is finally obtained said components being selected from Mo, Mo sulfides, Pb, Pb sulfides and S;
   b. reducing the cross section of said composite;
   c. thermally treating said reduced cross section composite at a temperature above 800° C. and a pressure of at least 100 kg/cm$^2$ to produce a $PbMo_6S_8$ compound of excellent stoichiometric composition and electrical characteristics; and d. putting a common electric conductive metal that is a good thermal and electrical conductor on said thermally treated composite.

9. A process for producing $PbMo_6S_8$ type compound superconductor according to claim 8 wherein the thermal treatment is carried out with a pressure above 1500 kg/cm² at a temperature above 900° C.

10. A process for producing $PbMo_6S_8$ compound superconductor according to claim 8 wherein the common metal that is a good thermal and electrical conductor is copper or aluminum.

11. A process for producing $PbMo_6S_8$ compound superconductor according to claim 10 wherein the common metal that is a good thermal and electrical conductor is copper.

* * * * *